United States Patent
Krieger

(10) Patent No.: US 8,710,628 B2
(45) Date of Patent: Apr. 29, 2014

(54) SWITCHABLE MEMORY DIODES BASED ON FERROELECTRIC/CONJUGATED POLYMER HETEROSTRUCTURES AND/OR THEIR COMPOSITES

(75) Inventor: Juri H. Krieger, Novosibirsk (RU)

(73) Assignee: Spansion LLC, Sunnyvale, CA (US)

( * ) Notice: Subject to any disclaimer, the term of this patent is extended or adjusted under 35 U.S.C. 154(b) by 34 days.

(21) Appl. No.: 13/316,137

(22) Filed: Dec. 9, 2011

(65) Prior Publication Data

US 2012/0080773 A1 Apr. 5, 2012

Related U.S. Application Data

(62) Division of application No. 11/350,556, filed on Feb. 9, 2006, now Pat. No. 8,089,110.

(51) Int. Cl.
*H01L 29/866* (2006.01)
(52) U.S. Cl.
USPC ............. 257/603; 257/424; 257/425; 257/40; 257/E21.27; 257/E51.02
(58) Field of Classification Search
USPC .................. 257/295, 424, 425, 40, 310, 296, 257/E21.27, E51.02
See application file for complete search history.

(56) References Cited

U.S. PATENT DOCUMENTS

| | | | |
|---|---|---|---|
| 6,344,991 B1 * | 2/2002 | Mikami et al. | 365/145 |
| 2005/0175086 A1 * | 8/2005 | Kang | 375/240.01 |
| 2007/0170481 A1 * | 7/2007 | Kang et al. | 257/295 |

FOREIGN PATENT DOCUMENTS

JP 2002-299580 * 10/2008

OTHER PUBLICATIONS

Study of Ferroelectricity and Current-Voltage Characteristics of CdZnTe, D.J. Fu, J.C. Lee, S.W. Choi, S.J. Lee, T.W. Kang, M.S. Jang, H.I. Lee, Y.D. Woo, Applied Physics Letters, vol. 81, No. 27, Dec. 30, 2002, pp. 5207-5209.

* cited by examiner

*Primary Examiner* — Cathy N Lam

(57) ABSTRACT

An embodiment of the present memory cell a first layer of a chosen conductivity type, and a second layer which includes ferroelectric semiconductor material of the opposite conductivity type, the layers forming a pn junction. The first layer may be a conjugated semiconductor polymer, or may also be of ferroelectric semiconductor material. The layers are provided between first and electrodes. In another embodiment, a single layer of a composite of conjugated semiconductor polymer and ferroelectric semiconductor material is provided between first and second electrodes. The various embodiments may be part of a memory array.

5 Claims, 8 Drawing Sheets

SWITCHABLE MEMORY DIODES BASED ON FERROELECTRIC/CONJUGATED POLYMER HETEROSTRUCTURES AND/OR THEIR COMPOSITES

CROSS-REFERENCE TO RELATED APPLICATIONS

This application is a divisional of U.S. patent application Ser. No. 11/350,556, filed on Feb. 9, 2006, entitled "Switchable Memory Diodes Based on Ferroelectric/Conjugated Polymer Heterostructures and/or Their Composites," which is hereby incorporated herein by reference in its entirety.

BACKGROUND OF THE INVENTION

1. Technical Field

This invention relates generally to memory cells, and in particular to a memory cells which utilize ferroelectric (inorganic and polymer) materials, conjugated polymers and related materials (phthalocyanines, porphyrines, organic-charge transfer complexes and the like) and/or their composites.

2. Background Art

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums.

Also, memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

As such, each memory cell in a memory device can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte).

For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase speed and storage retrieval for memory devices (e.g., increase write/read speed). At the same time, to reach high storage densities, manufacturers typically focus on scaling down semiconductor device dimensions (e.g., at submicron levels). Nonetheless, formation of various transistor type control devices that are typically required for programming memory cell arrays increase costs and reduces efficiency of circuit design.

Therefore, there is a need to overcome the aforementioned deficiencies associated with conventional devices.

DISCLOSURE OF THE INVENTION

Broadly stated, the present memory cell comprises a first layer of a chosen conductivity type, and a second layer which includes ferroelectric semiconductor material of the opposite conductivity type, the layers forming a pn junction. The first layer may be a conjugated polymer, or may also be of ferroelectric semiconductor material. The layers are provided between first and second electrodes. In another embodiment, a single layer of a composite of conjugated polymer and ferroelectric semiconductor material is provided between first and second electrodes. The various embodiments may be part of a memory array.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventor for practicing the invention.

Figure 1:
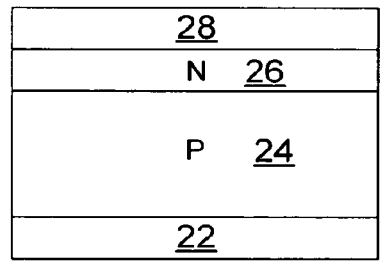
FIG. 1 is a sectional view of a first embodiment of memory cell.

FIG. 1 illustrates a first embodiment of the present memory cell 20. As shown therein, a first electrode 22 with a high work function, for example platinum, is provided. Provided on, over and in contact with the electrode 22, and forming a Schottky contact with the electrode 22, is a layer 24 of ferroelectric semiconductor material, i.e., a material which, through application of electric fields or other energy sources, can be polarized into two different states. (As is well known, despite its name, ferroelectric material does not necessarily contain iron). Examples of such materials are $Pb(Zr, Ti)O_3$ (PZT) systems, $SrBi_2Ta_2O_9$ (SBT) systems, $Bi_4Ti_3O_{12}$ (BIT) systems, $BaTiO_3$ (BTO) systems, CdZnS, poly(vinylidene fluoride-trifluoroethylene) [P(VDF-TrFE)] copolymer, polyamides (Nylon-5, Nylon-7, Nylon-11), and polyureas (Polyureas-9). The layer 24 may be for example 300-1000 Å thick. Provided on, over and in contact with the layer 24 is a conjugated semiconductor polymer layer 26 (or other material, or a composite of materials). Examples for layer 26 are: polyaniline, polythiophene, polypyrrole, polysilane, polyfuran, polyindole, polyazulene, polyphenylene, polypyridine, polybipyridine, polysexithiofene, and their derivatives; metallo-organic complexes such as porphyrin, phthalocyanine, polyphthalocyanine, hexadecafluoro-phthalocyanine and their derivatives; and organic-charge transfer complexes such as N-Ethylcarbazole, tetrathiotetracene, tetrathiofulvalene, tetracyanoquinodimethane, tetracyanoethylene, cloranol, dinitro-n phenyl; and their derivatives. This layer 26 may be, for example, 30-100 Å thick. Provided on, over and in contact with the conjugated semiconductor polymer layer 26 and forming a Schottky contact with the layer 26 is another electrode 28 with a high work function, for example platinum. It will readily be seen that the layers 24, 26 are between the electrodes 22, 28.

In this example, the layer 24 is of p type conductivity, while the layer 26 is of n type conductivity, so that the layers 24, 26 form a diode having a pn junction where the layers 24, 26 come together. The memory cell 20 can be described as two back-to back Schottky diodes with ferroelectric semiconductor material (thickness 300-1000 Å) 24 and conjugated semiconductor polymer (or related materials) thin film (thickness 30-100 Å) in between two metal electrodes with high work function.

Figure 2:
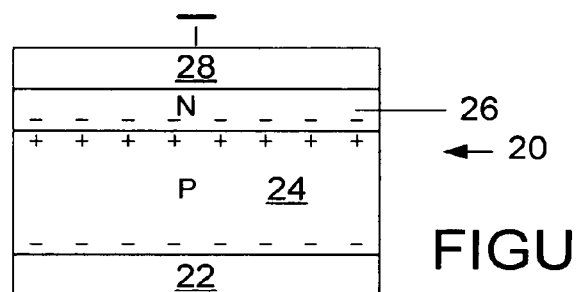
FIG. 2 is a view illustrating programming of the memory cell of FIG. 1.

FIG. 2 illustrates programming of the memory cell 20. In the programming procedure, a positive voltage is applied to the electrode 22, while a negative voltage is applied to the electrode 28, so that an electrical potential ($V_{pg}$) is applied across the cell 20 from higher to lower potential in the direction from the electrode 22 to the electrode 28. In accordance with the ferroelectric properties of the layer 24, positive charge will be generated within the layer 24 near the surface of the layer 24 adjacent the conjugated semiconductor polymer layer 26, while negative charge will be generated within the layer 24 near the surface of the layer 24 adjacent the electrode 22. With the memory cell in such state, p type charge carriers are moved within layer 24 to adjacent the layer 26, while compensating n type charge carriers are moved within the layer 26 to adjacent the layer 24. This causes the depletion region at the junction of the layer 24 and layer 26 to be relatively small. The ferroelectric semiconductor layer 24, in accordance with its operating characteristics, retains this state after the electrical potential is removed, so that upon removal of the electrical potential after programming of the memory cell 20, the memory cell 20 retains its programmed state.

Figure 3:
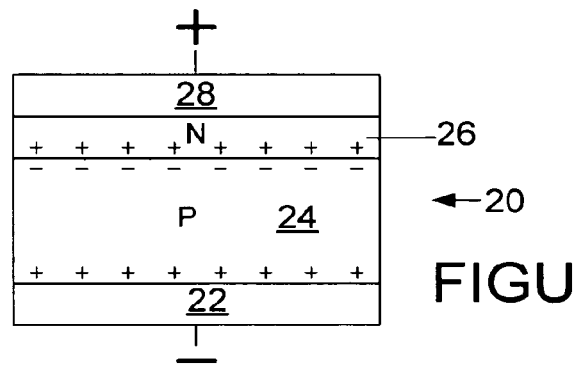
FIG. 3 is a view illustrating erasing of the memory cell of FIG. 1.

FIG. 3 illustrates erasing of the memory cell 20. In the erasing procedure, a positive voltage is applied to the electrode 28, while a negative voltage is applied to the electrode 22, so that an electrical potential ($V_{er}$) is applied across the cell 20 from higher to lower potential in the direction from the electrode 28 to the electrode 22. In accordance with the ferroelectric properties of the layer 24, negative charge will be generated within the layer 24 near the surface of the layer 24 adjacent the conjugated semiconductor polymer layer 26, while positive charge will be generated within the layer 24 near the surface of the layer 24 adjacent the electrode 22. With the memory cell 20 in such state, n type charge carriers are moved within layer 24 to adjacent the layer 26, while compensating p type charge carriers are moved within the layer 26 to adjacent the layer 24. This causes the depletion region at the junction of the layer 24 and layer 26 to be much larger than in the programmed state. Again, the ferroelectric semiconductor layer 24, in accordance with its operating characteristics, retains this state after the electrical potentials are removed, so that upon removal of the electrical potential after erasing of the memory cell 20, the memory cell 20 retains its erased state.

Figure 4:
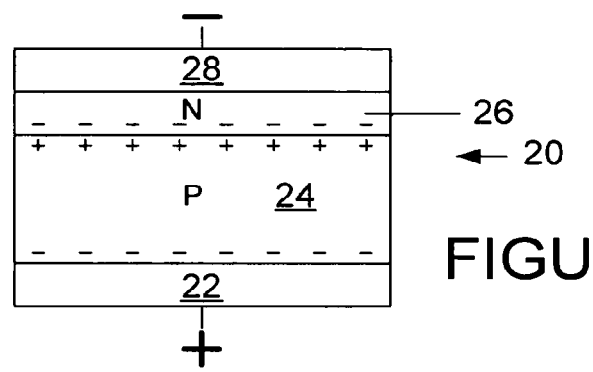
FIG. 4 is a view illustrating reading of the memory cell of FIG. 1 in its programmed state.

FIG. 4 illustrates reading of the memory cell 20 in its programmed state. As such, a positive voltage is applied to the electrode 22, while a negative voltage is applied to the electrode 28, so that an electrical potential ($V_r < V_{pg}$) is applied across the cell 20 from higher to lower potential in the direction from the electrode 22 to the electrode 28, in the same direction as the programming potential. With the memory cell 20 having a small depletion region as described above, current will readily flow through the memory cell 20, indicating the programmed state of the memory cell 20.

Figure 5:
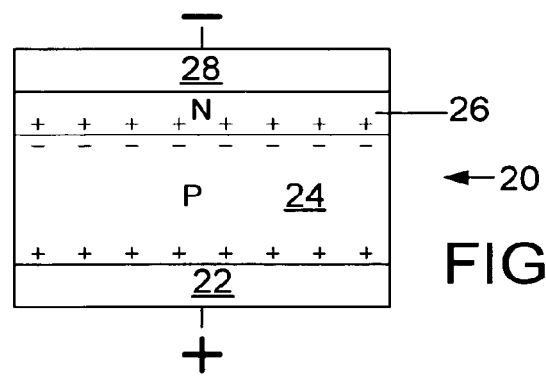
FIG. 5 is a view illustrating reading of the memory cell of FIG. 1 in its erased state.

FIG. 5 illustrates reading of the memory cell 20 in its erased state. As such, again, a positive voltage is applied to the electrode 22, while a negative voltage is applied to the electrode 28, so that electrical potential ($V_r$) is applied across the cell 20 from higher to lower potential in the direction from the electrode 22 to the electrode 28 (opposite direction to read and program potential). With the memory cell 20 having a large depletion region has described above, minimal current will flow through the memory cell 20, indicating the erased state of the memory cell 20.

The memory cell 20 may use diode phenomena and/or tunneling phenomena in the steps described above, depending on the design of the memory cell 20.

Figure 6:
FIG. 6 illustrates the memory cell of FIG. 1 in series with a diode.
Figure 7:
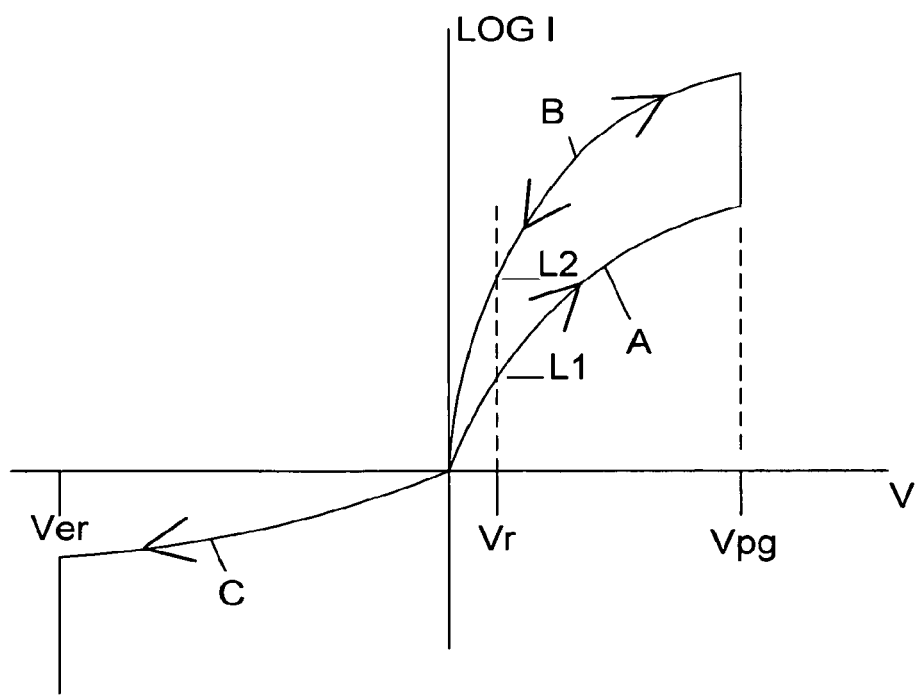
FIG. 7 is a graph illustrating current-voltage characteristics of the memory cell and diode of FIG. 1.

FIG. 6 illustrates the memory cell 20 in series with a zener diode 30. The current-voltage characteristics of the structure of FIG. 6 are illustrated in FIG. 7, which is a plot of electrical potential vs. log current. With the memory cell 20 in its erased state, programming voltage $V_{pg}$ is applied across the memory cell 20 as described above. A relatively low level of increasing current results (A) until the programmed state is achieved. In its programmed state, an on-resistance characteristic shown at (B) is provided. In erasing the memory cell 20, when reverse breakdown voltage $V_{er}$ is reached, the zener diode 30 allows current therethrough (and through the memory cell 20) in the reverse direction, as illustrated at (C), resulting in erasing of the memory cell 20. As will also be seen from FIG. 7, and in accordance with the discussion above, application of the read potential $V_r$ to an erased memory cell 20 provides a relatively low level of current therethrough (L1, indicating the erased state of the memory cell 20), while application of the read potential $V_r$ to a programmed memory cell 20 provides a much higher level of current therethrough (L2, indicating the programmed state of the memory cell 20).

The electrical and operational properties of the memory cell 20 can be changed, for example, by changing the doping characteristics of the conjugated semiconductor polymer layer 26, i.e., by using various n or p dopants of selected dopant levels therein. Furthermore, it will be understood that the conductivity types themselves can be reversed if so chosen. The electrical and operational properties of the memory cell 20 can also be changed by changing the magnitude of one or both of the applied programming potential and erase potential. In addition, the electrical and operational properties of the memory cell can be changed based on the various work functions of electrodes of different compositions.

It will be seen that provided herein is a memory cell 20 switchable between two different states. In the present approach, this is due to the inclusion of ferroelectric semiconductor material which has the operating characteristics described above. The retention time of such a memory cell 20 is dependent on retaining the electrical polarization as described above for the programmed and erased states, and in the approach taken, the retention time of each chosen state is substantial.

Figure 8:
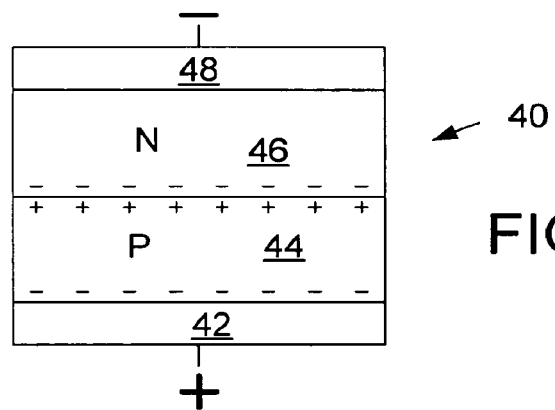
FIG. 8 is a sectional view of a second embodiment of memory, illustrating programming thereof.
Figure 9:
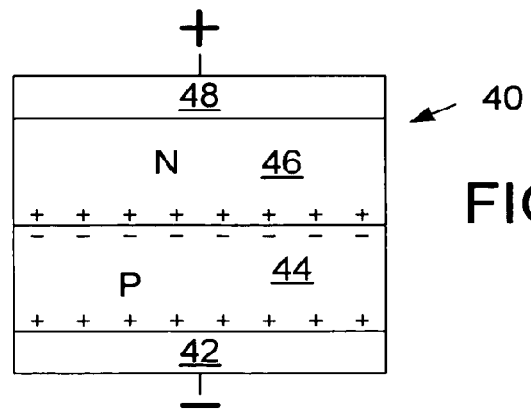
FIG. 9 is a view illustrating erasing of the memory cell of FIG. 8.

FIGS. 8 and 9 illustrate a second embodiment of the invention. As such, the memory cell 40 includes electrodes 42, 48 and layer 44 of p type ferroelectric semiconductor material as described above, but now includes a layer 46 of n type semiconductor material such as doped silicon, germanium, tin oxide, or metal dichalcogenides (MX2: M=Mo, W; X=S, Se) in place of the conjugated semiconductor polymer layer. In the programming procedure (FIG. 8), again, a positive voltage is applied to the electrode 42, while a negative voltage is applied to the electrode 48, so that an electrical potential ($V_{pg}$) is applied across the cell 20 from higher to lower potential in the direction from the electrode 42 to the electrode 48. In accordance with the ferroelectric properties of the layer 44, positive charge will be generated within the layer 44 near the surface of the layer 44 adjacent the semiconductor layer 46, while negative charge will be generated within the layer 44 near the surface of the layer 44 adjacent the electrode 42. With the memory cell 40 in such state, p type charge carriers are moved within layer 44 to adjacent the semiconductor layer 46, while compensating n type charge carriers are moved within the layer 46 to adjacent the ferroelectric semiconductor material layer 44. This causes the depletion region at the junction of the layer 44 and layer 46 to be relatively small, so that when a read voltage is applied, relatively high current passes through the memory cell 40.

In the erasing procedure, a positive voltage is applied to the electrode 48, while a negative voltage is applied to the electrode 42, so that an electrical potential ($V_{er}$) is applied across the cell 40 from higher to lower potential in the direction from the electrode 48 to the electrode 42. In accordance with the ferroelectric properties of the layer 44, negative charge will be generated within the layer 44 near the surface of the layer 44 adjacent the semiconductor layer 46, while positive charge will be generated within the layer 44 near the surface of the layer 44 adjacent the electrode 42. With the memory cell 40 in such state, n type charge carriers are moved within layer 44 to adjacent the semiconductor layer 46, while compensating p type charge carriers are moved within the layer 46 to adjacent the layer 44. This causes the depletion region at the junction of the layer 44 and layer 46 to be much larger than in the programmed state so that when the read voltage is applied, minimal current passes through the memory cell 40.

Again, it will be understood that various dopants can be used to achieve the conductivity types of the layers 44, 46, and that the conductivity types them can be reversed if so chosen.

Figure 10:
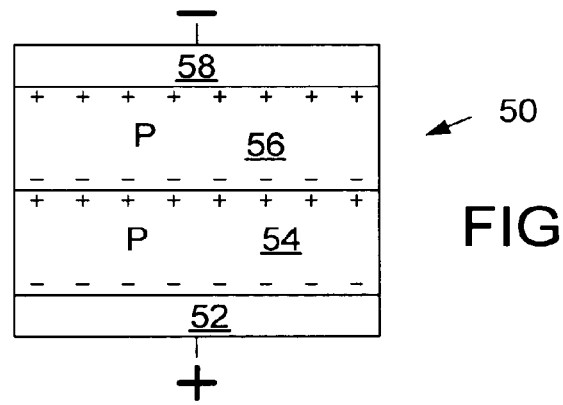
FIG. 10 is a sectional view of a third embodiment of memory cell, illustrating programming thereof.
Figure 11:
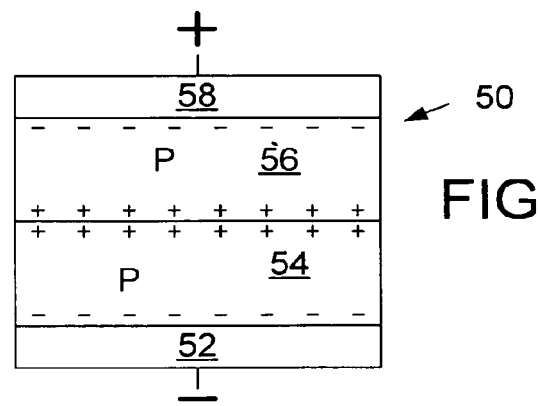
FIG. 11 is a view illustrating erasing of the memory cell of FIG. 10.

FIGS. 10 and 11 illustrate a third embodiment of the invention. As such, the memory cell 50 includes electrodes 52, 58 and p type layer 54 of ferroelectric semiconductor material as described above with respect to FIGS. 1-5, but now includes another p type layer 56 of ferroelectric semiconductor material in place of the conjugated polymer layer, but with the ferroelectric semiconductor material of the layer 56 having a switching potential which is different from the switching potential of the ferroelectric semiconductor material of the layer 54 (achieved by providing different doping characteristics of the layers 54, 56). In this particular example, the switching potential of the layer 56 is lower than the switching potential of the layer 54, i.e., layer 56 requires a lower potential for switching its state than layer 54.

In the programming procedure (FIG. 10), again, a positive voltage is applied to the electrode 52, while a negative voltage is applied to the electrode 58, so that an electrical potential ($V_{pg}$) is applied across the cell 50 from higher to lower potential in the direction from the electrode 52 to the electrode 58. This electrical potential is a sufficient magnitude to cause both of the layers 54, 56 to switch to the states shown in FIG. 10. This causes the depletion region at the junction of the layer 54 and layer 56 to be relatively small, so that when a read voltage is applied to the memory cell 50, relatively high current passes through the memory cell 50.

In the erasing procedure (FIG. 11), a positive voltage is applied to the electrode 58, while a negative voltage is applied to the electrode 52, so that an electrical potential ($V_{er}$) is applied across the cell 50 from higher to lower potential in the direction from the electrode 58 to the electrode 52. This electrical potential is of sufficient magnitude to cause only the layer 56 to switch its state, but is not of sufficient magnitude to cause the layer 54 to switch its state, as illustrated in FIG. 11. This causes the depletion region at the junction of the layer 54 and layer 56 to be relatively large, so that when a read voltage is applied to the memory cell 50, minimal current passes through the memory cell 50.

Either or both of the ferroelectric semiconductor material layers 44, 46 can instead take the form of a ferroelectric semiconductor material/conjugated polymer layer composite layer (44, 46) chosen to provide particular operating characteristics of the memory cell 50.

Figure 12:
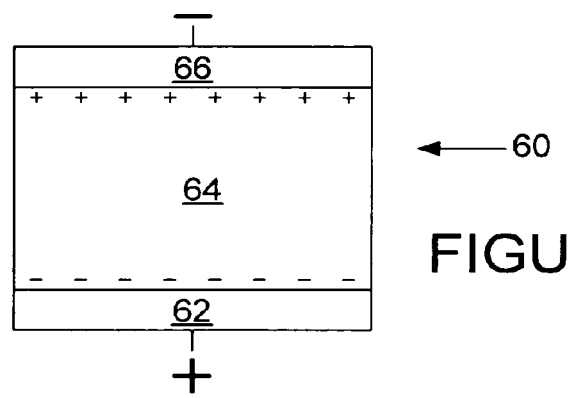
FIG. 12 is a sectional view of a fourth embodiment of memory cell, illustrating programming thereof.
Figure 13:
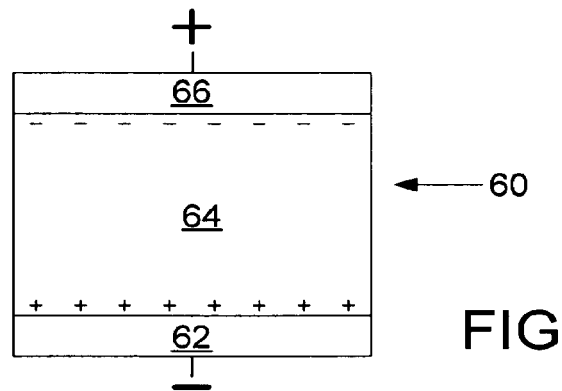
FIG. 13 is a view illustrating erasing of the memory cell of FIG. 12.

FIGS. 12 and 13 illustrate a fourth embodiment of the invention. As such, the memory cell 60 includes electrodes 62, 66, but now includes only a layer 64 therebetween which is a composite of ferroelectric semiconductor material as described above and a conjugated polymer.

In the programming procedure (FIG. 12), again, a positive voltage is applied to the electrode 62, while a negative voltage is applied to the electrode 66, so that an electrical potential ($V_{pg}$) is applied across the cell 60 from higher to lower potential in the direction from the electrode 62 to the electrode 66. This electrical potential causes the layer 64 to switch to the state shown in FIG. 12.

In the erasing procedure (FIG. 13), a positive voltage is applied to the electrode 66, while a negative voltage is applied to the electrode 62, so that an electrical potential ($V_{er}$) is applied across the cell 60 from higher to lower potential in the direction from the electrode 66 to the electrode 62. This electrical potential causes the layer 64 to switch to the state shown in FIG. 12.

Figure 14:
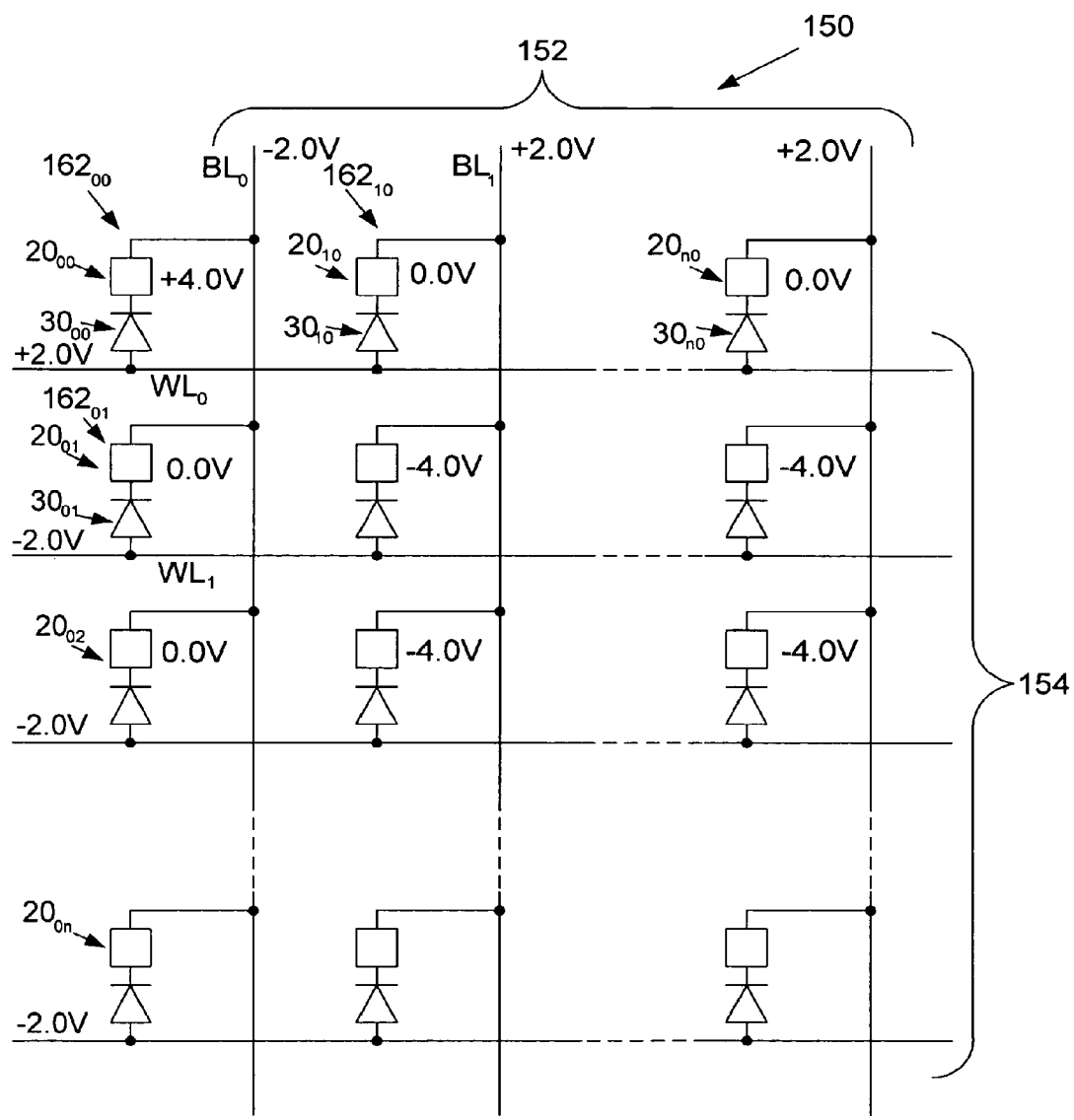
FIG. 14 is a schematic view of a memory array incorporating the various embodiments of memory cell, illustrating programming of a selected cell.
Figure 15:
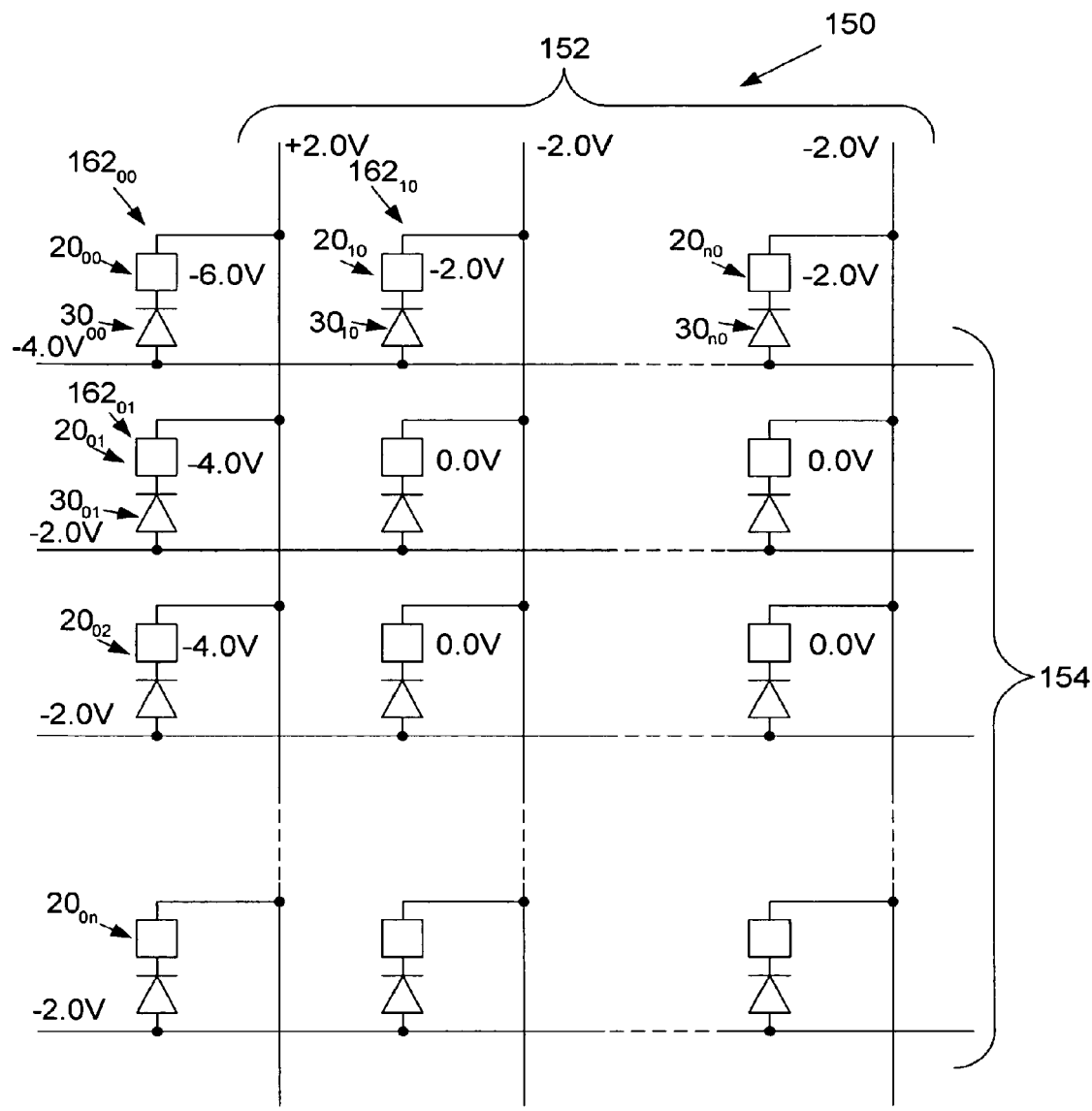
FIG. 15 is a view similar to that of FIG. 14, but illustrating erasing of the selected cell.

FIGS. 14 and 15 illustrate a memory cell array 150 which incorporates any of the memory cells of the type described above. As illustrated in FIG. 14, the memory cell array 150 includes a first plurality 152 of parallel conductors (bit lines) $BL_0$, $BL_1$, ... $BL_n$, and a second plurality 154 of parallel conductors (word lines) $WL_0$, $WL_1$, ... $WL_n$ overlying and spaced from, orthogonal to, and crossing the first plurality of conductors 152. A plurality of memory cells of the type described above, for example memory cells 20, are included, each associated with a zener diode 30 to form a memory cell-diode structure 162 connecting a bit line and a word line. Each memory device 20 is connected in series with a zener diode 30 between a conductor BL of the first plurality 152 thereof and a conductor WL of the second plurality 154 thereof at the intersection of those conductors, with the zener diode 30 oriented in a forward direction from the conductor WL of the second plurality 154 thereof to the conductor BL of the first plurality 152 thereof. For example, as shown in FIGS. 14 and 15, zener diode $30_{00}$ and memory cell $20_{00}$ in series connect conductor $WL_0$ of the second plurality of conductors 154 with conductor $BL_0$ of the first plurality of conductors 152 at the intersection of those conductors $BL_0$, $WL_0$, zener diode $30_{10}$ and memory cell $20_{10}$ in series connect conductor $WL_0$ of the second plurality of conductors 154 with conductor $BL_1$ of the first plurality of conductors 152 at the intersection of those conductors $BL_1$, $WL_0$, etc. The programming and erasing of a selected memory cell, in this example memory cell $20_{00}$, can be achieve by applying the potentials as illustrated in FIGS. 14 (program) and 15 (erase). All memory cells as shown and described can readily be used in an array without the necessity of including an addressable transistor for each memory cell, greatly simplifying the array.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory cell comprising:
   a first layer comprising ferroelectric material; and
   a second layer on the first layer comprising ferroelectric material wherein the second layer is one of n or p conductivity type and wherein the first layer is of the same conductivity type as the second layer.

2. The memory cell of claim 1 wherein the ferroelectric material of the first layer has a different switching potential from that of the ferroelectric material of the second layer.

3. The memory cell of claim 2 and further comprising a diode in series with the memory cell.

4. The memory cell of claim 3 wherein the diode is a zener diode.

5. The memory cell of claim 2 and further comprising first and second electrodes, the first and second layers being between the first and second electrodes.

* * * * *